United States Patent
Fahrenbruch et al.

(10) Patent No.: US 8,842,397 B2
(45) Date of Patent: Sep. 23, 2014

(54) PHOTO-VOLTAIC SAFETY DE-ENERGIZING DEVICE

(75) Inventors: Shawn Anthony Fahrenbruch, Fresno, CA (US); Bruce Ferguson, Anaheim, CA (US); Ekrem Cengelci, Garden Grove, CA (US)

(73) Assignee: Microsemi Corporation, Aliso Viejo, CA (US)

( * ) Notice: Subject to any disclaimer, the term of this patent is extended or adjusted under 35 U.S.C. 154(b) by 150 days.

(21) Appl. No.: 13/478,125

(22) Filed: May 23, 2012

(65) Prior Publication Data

US 2012/0300347 A1    Nov. 29, 2012

Related U.S. Application Data

(60) Provisional application No. 61/488,881, filed on May 23, 2011.

(51) Int. Cl.
*H02H 3/00* (2006.01)
*H01L 31/02* (2006.01)

(52) U.S. Cl.
CPC ........... *H01L 31/02021* (2013.01); *Y02E 10/50* (2013.01)
USPC ............................................. 361/1; 361/91.4

(58) Field of Classification Search
USPC .......... 361/84; 307/71, 82; 136/234, 244, 245
See application file for complete search history.

(56) References Cited

U.S. PATENT DOCUMENTS

| | | | |
|---|---|---|---|
| 4,728,825 A | 3/1988 | Sugayama et al. | |
| 5,327,071 A * | 7/1994 | Frederick et al. | 323/299 |
| 6,271,712 B1 | 8/2001 | Ball | |
| 6,593,520 B2 * | 7/2003 | Kondo et al. | 136/244 |
| 6,864,414 B2 | 3/2005 | Sharps | |
| 7,199,636 B2 | 4/2007 | Oswald | |
| 7,612,283 B2 * | 11/2009 | Toyomura et al. | 136/244 |
| 7,898,114 B2 | 3/2011 | Schmidt et al. | |

(Continued)

FOREIGN PATENT DOCUMENTS

| | | |
|---|---|---|
| FR | 1422496 | 12/1965 |
| JP | 2000-174308 | 6/2000 |
| WO | 2010078303 A2 | 7/2010 |
| WO | 2012069044 A2 | 5/2012 |

OTHER PUBLICATIONS

Shimizu, T; Hirakata, M.; Kamezawa, T.; and Watanabe, H; Generation Control Circuit for Photovoltaic Modules; IEEE Transactions on Power Electronics, vol. 16, No. 3, May 2001, pp. 293-300, Institute for Electrical and Electronics Engineers, Piscataway, N.J.

(Continued)

*Primary Examiner* — Jared Fureman
*Assistant Examiner* — Angela Brooks
(74) *Attorney, Agent, or Firm* — Simon Kahn

(57) ABSTRACT

A safety mechanism for a solar cell group, the safety mechanism constituted of: a signal receiver arranged to assert a permissive signal indicative of reception by the signal receiver of a predetermined signal; an electronically controlled switch arranged to provide in a closed state an effective short circuit across the output of the solar cell group responsive to the absence of the asserted permissive signal of the signal receiver; and a power harvester in communication with the solar cell group and arranged to provide electric power to the signal receiver when the electronically controlled switch is the closed state.

16 Claims, 4 Drawing Sheets

(56) References Cited

U.S. PATENT DOCUMENTS

| | | | |
|---|---|---|---|
| 7,969,700 B2* | 6/2011 | Coloma Calahorra et al. | 361/84 |
| 8,169,252 B2* | 5/2012 | Fahrenbruch et al. | 327/434 |
| 8,184,460 B2* | 5/2012 | O'Brien et al. | 363/97 |
| 8,217,534 B2* | 7/2012 | Sok et al. | 307/82 |
| 8,502,416 B2* | 8/2013 | Falk | 307/77 |
| 2004/0135545 A1 | 7/2004 | Fowler et al. | |
| 2007/0159866 A1* | 7/2007 | Siri | 363/95 |
| 2007/0186969 A1 | 8/2007 | Kohler | |
| 2008/0198523 A1 | 8/2008 | Schmidt et al. | |
| 2009/0014050 A1* | 1/2009 | Haaf | 136/244 |
| 2009/0195081 A1* | 8/2009 | Quardt et al. | 307/125 |
| 2010/0300508 A1* | 12/2010 | Maier et al. | 136/244 |
| 2011/0088741 A1* | 4/2011 | Dunton et al. | 136/244 |
| 2011/0210612 A1* | 9/2011 | Leutwein | 307/80 |
| 2012/0139347 A1* | 6/2012 | Hackenberg | 307/71 |
| 2012/0174961 A1* | 7/2012 | Larson et al. | 136/246 |

OTHER PUBLICATIONS

Tanzawa, Toru and Tomoharu, Tanaka; "A Dynamic Analysis of the Dickson Charge Pump Circuit"; IEEE Journal of Solid-State Circuits, Aug. 1997, pp. 1231-1240, vol. 32, No. 8; IEEE New York.

Makowski, Marek S.; "Realizability Conditions and Bounds on Synthesis of Switched-Capacitor DC-DC Voltage Multiplier Circuits"; IEEE Transactions on Circuits and Systems-I: Fundamental Theory and Applications, Aug. 1997, pp. 684-691, vol. 44 No. 8; IEEE New York.

Witters, Johan S, et al; "Analysis and Modeling of ON-Chip High-Voltage Generator Circuits for Use in EEPROM Circuits"; IEEE Journal of Solid-State Circuits, Oct. 1989, pp. 1372-1380, vol. 24, No. 5; IEEE New York.

Report of office action dated Nov. 5, 2013 for parallel German Application 102012010083.3.

* cited by examiner

PHOTO-VOLTAIC SAFETY DE-ENERGIZING DEVICE

CROSS-REFERENCE TO RELATED APPLICATION

This application claims priority from U.S. Provisional Patent Application Ser. No. 61/488,881 filed May 23, 2011, entitled "Photo-Voltaic Safety De-Energizing Device", the entire contents of which is incorporated herein by reference.

BACKGROUND OF THE INVENTION

The present invention relates to the field of Photo-Voltaic (PV) solar power, and in particular to methods and apparatuses for providing a safety short mechanism for a solar cell group.

PV solar modules generate electricity responsive to solar light energy, and are typically arranged in a series loop with a DC/AC converter, the DC/AC converter arranged to convert the DC power of the series connected PV solar modules to an AC electricity, preferably in phase with an AC mains power. As will be described below, PV solar modules typically comprises a plurality of serially connected solar cells, typically comprising a plurality of groups of solar cells. In the event that certain cells are not generating electricity, and others in the serial connection are generating electricity, polarity of the non-generating cells, or group of cells, reverse. In order to prevent a damaging reverse potential, a bypass element is required such that in the event that the reverse potential exceeds a predetermined value a low resistance bypass path is provided.

Various hazardous conditions have been identified for which a safe mode of operation of a PV solar module is necessitated. These hazards can be separated into three categories.

The first category of hazard could be considered as being caused by the PV installation itself. For example, if a PV electrical current carrying conductive wire exhibits a poor connection, dangerous arcing may occur which can ignite a fire. As another example, if the electrical output of the PV system were to accidentally touch another electrical conductor of a different voltage potential, this can similarly ignite a fire. Attempts to mitigate the danger of fire causing arcing are addressed, or in the process of being addressed, by various electrical code setting organizations, such the National Fire Protection Association (NFPA) in the United States, which issues the National Electrical Code (NEC). Due to limited technology available at the time of code writing, not all PV arcing scenarios can be addressed. The 2011 NEC 690 addresses "series" faults, but does not address "parallel" PV-faults, primarily due to the paucity of commercially available solutions. In addition to the NFPA, the issue is being addressed by Underwriters Laboratory (UL) in the UL1699-PV ad hoc working committee, and by the International Electrotechnical Commission (IEC) in an IEC TC 82 committee.

The second category of hazard is electrocution hazard for emergency response crews. For example, if a structure which is in proximity to a PV installation is on fire, fire responders need an ability to remove all electrical hazards prior to entering the fire zone. At present, in DC-string inverter based PV systems, the fire responders can only disconnect the inverter or load. Unfortunately, the source of energy still remains and thus lethal levels, e.g. 600 Volts DC, of electrical energy are still present. It should be noted that the cause of the fire is irrelevant for this category of hazard. It may have been caused by the PV equipment or by other sources. Regardless, the electrocution risk to fire responders still needs to be addressed.

The third category of hazard occurs during the installation and/or maintenance of PV systems. For the most part, this hazard is mitigated by proper training of installation/service personnel. However, even with the best of training, accidents may occur. Because solar cells are energized whenever light is present, PV installation and servicing can not be guaranteed to occur in the absence of potentially lethal voltage unless a failsafe mechanism to prevent energy from being converted is available.

Various methods are being actively considered to resolve the issue, and a study of this matter has been presented at the Feb. 15, 2011 PV-Safety Conference held in San Francisco, Calif. Each of the various methods exhibit advantages and disadvantages, however the approach of arranging for a short circuit of the PV module seems to exhibit the best potential solution, since in such an approach: the inverter is free of input voltage; the DC main line is de-energized; the DC connection box is de-energized; the DC string is de-energized; the module itself is de-energized; existing inverters do not need to be redesigned; no additional line losses occur as a result of the safety mechanism; and automatic shut off in the event of an AC power failure can be arranged.

Unfortunately, the prior art does not teach any method of supporting such as safety mechanism, in particular since in the short circuit condition no power is available at the short circuited PV module to maintain the short circuit, or disable the short circuit responsive to an enablement signal.

In particular, a bypass transistor requires an energy source to allow it to be conductive. This statement would apply to enhancement mode MOS transistors as well as bipolar transistors. It does not apply to depletion mode transistors, but the complexity of turning these depletion mode transistors off in normal mode introduces an entirely new list of other considerations which adds to cost and complexity. In the event of a fire, no guarantee can be given that a reliable energy source for a signal to control these transistors will be present.

SUMMARY OF THE INVENTION

Accordingly, it is a principal object of the present invention to overcome at least some of the disadvantages of the prior art. This is provided in certain embodiments by a safety mechanism comprising an electronically controlled transistor and a signal receiver, wherein power for the signal receiver and optionally for the electronically controlled switch, are harvested from across the electronically controlled switch.

In one particular embodiment, a safety mechanism for a solar cell group is enabled, the safety mechanism comprising: a signal receiver arranged to assert a permissive signal indicative of reception by the signal receiver of a predetermined signal; an electronically controlled switch arranged to provide in a first state an effective short circuit across the output of the solar cell group responsive to the absence of the asserted permissive signal of the signal receiver; and a power harvester in communication with the solar cell group and arranged to provide an electric power to the signal receiver when the electronically controlled switch is the first state.

In one embodiment a safety mechanism for a solar cell group is enabled, the safety mechanism comprising: a signal receiver arranged to assert a permissive signal indicative of reception by the signal receiver of a predetermined signal; an electronically controlled switch arranged to provide in a first state an effective short circuit across the output of the solar cell group responsive to the absence of the asserted permissive signal of the signal receiver; and a power harvester in communication with the solar cell group and arranged to provide an electric power to the signal receiver when the electronically controlled switch is in the first state.

In one further embodiment, the signal receiver is further arranged to de-assert the permissive signal responsive to one of: non-reception by the signal receiver of the predetermined signal; and a lack of the provided electrical power from the power harvester. In another further embodiment, the power harvester is further arranged to supply power to the electronically controlled switch so as to maintain the electronically controlled switch in the first state. In another further embodiment, the provided electric power from the power harvester, when the electronically controlled switch is in the first state, is discontinuously provided to the signal receiver.

In one further embodiment, the solar cell group comprises a cathode terminal and an anode terminal, and wherein the safety mechanism further comprises a control circuitry arranged to set the electronically controlled switch to the first state when the cathode terminal of the solar cell group is negative in relation to the anode terminal of the solar cell group, thus providing a bypass mechanism for the solar cell group. In one yet further embodiment, the control circuitry is further arranged to: set the electronically controlled switch to a second state when the cathode terminal of the solar cell group is positive in relation to the anode terminal of the solar cell group and the permissive signal is asserted by the signal receiver, the electronically controlled switch in the second state arranged to allow the solar generated output of the solar cell group to appear across the output terminals of the solar cell group; and wherein the power harvester is arranged to provide the electric power to the signal receiver from the solar generated output of the solar cell group when the electronically controlled switch is the second state.

In one further embodiment, the power harvester comprises a direct current (DC) to DC amplifier arranged to amplify the voltage drop across the electronically controlled switch when the electronically controlled switch is in the first state so as to thereby provide the electric power to the signal receiver when the electronically controlled switch is in the first state.

In one further embodiment, the power harvester comprises a direct current (DC) to DC amplifier, and wherein the solar cell group exhibits a cathode terminal and anode terminal, and wherein the safety mechanism further comprises a polarity control circuit arranged to connect the DC to DC amplifier to the respective cathode terminal and anode terminal of the solar cell group alternately in a first polarity and in a second polarity. In one yet further embodiment, the safety mechanism further comprises a control circuit, the polarity control circuit responsive to the control circuit, the control circuit arranged to set the polarity control circuit to connect the positive input of the DC to DC amplifier to the cathode terminal of the solar cell group responsive to: the solar cell group cathode terminal electric potential being greater than the solar cell group anode terminal electric potential; and the absence of the asserted permissive signal of the signal receiver. In one yet further, further embodiment, the control circuit is further arranged to set the polarity control circuit to connect the positive input of the DC to DC amplifier to the anode terminal of the solar cell group responsive to: the solar cell group anode terminal electric potential being greater than the solar cell group cathode terminal electric potential; or the presence of the asserted permissive signal of the signal receiver. In another yet further, further embodiment, the control circuit is further arranged to prevent the electronically controlled switch from providing the effective short circuit across the output of the solar cell group responsive to: the solar cell group cathode terminal electric potential being greater than the solar cell group anode terminal electric potential; and the presence of the asserted permissive signal of the signal receiver.

Independently, a method of providing safety for a solar cell group is enabled, the method comprising: asserting a permissive signal output from a signal receiver responsive to reception of a predetermined signal by the signal receiver; providing an effective short circuit across the output of the solar cell group responsive to the absence of the asserted permissive signal; harvesting power from across the solar cell group; and supplying at least a portion of the harvested power to the signal receiver when the effective short circuit is provided.

In one further embodiment, the method further comprises supplying at least a portion of the harvested power to maintain the provided effective short circuit. In another further embodiment, the supplied harvested power is supplied to the signal receiver discontinuously.

In one further embodiment, the method further comprises additionally providing the effective short when the cathode terminal of the solar cell group exhibits a negative potential in relation to the anode terminal of the solar cell group. In another further embodiment, the harvesting power comprises: amplifying the voltage drop across an electronically controlled switch arranged to provide the provided effective short circuit.

In one further embodiment, the harvesting power comprises: coupling the cathode terminal of the solar cell group to an amplifier in a first polarity; amplifying the voltage potential difference between the cathode terminal and the anode terminal so as to harvest the harvested power responsive to: the solar cell group cathode potential being greater than the solar cell group anode potential; and the absence of the asserted permissive signal of the signal receiver. In one yet further embodiment, the method further comprises: coupling the cathode terminal of the solar cell group to the amplifier in a second polarity, the second polarity opposing the first polarity, responsive to: the solar cell group anode terminal potential being greater than the solar cell group cathode terminal potential; or the presence of the asserted permissive signal of the signal receiver. In another yet further embodiment, the harvesting comprises: coupling electric power from a solar generated output of the solar cell group when the effective short circuit across the output of the solar cell group is not provided.

In one further embodiment, the method further comprises: preventing the providing of the effective short circuit across the output of the solar cell group responsive to: the solar cell group cathode terminal potential being greater than the solar cell group anode terminal potential; and the presence of the asserted permissive signal of the signal receiver.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

DETAILED DESCRIPTION OF PREFERRED EMBODIMENTS

Figure 1:
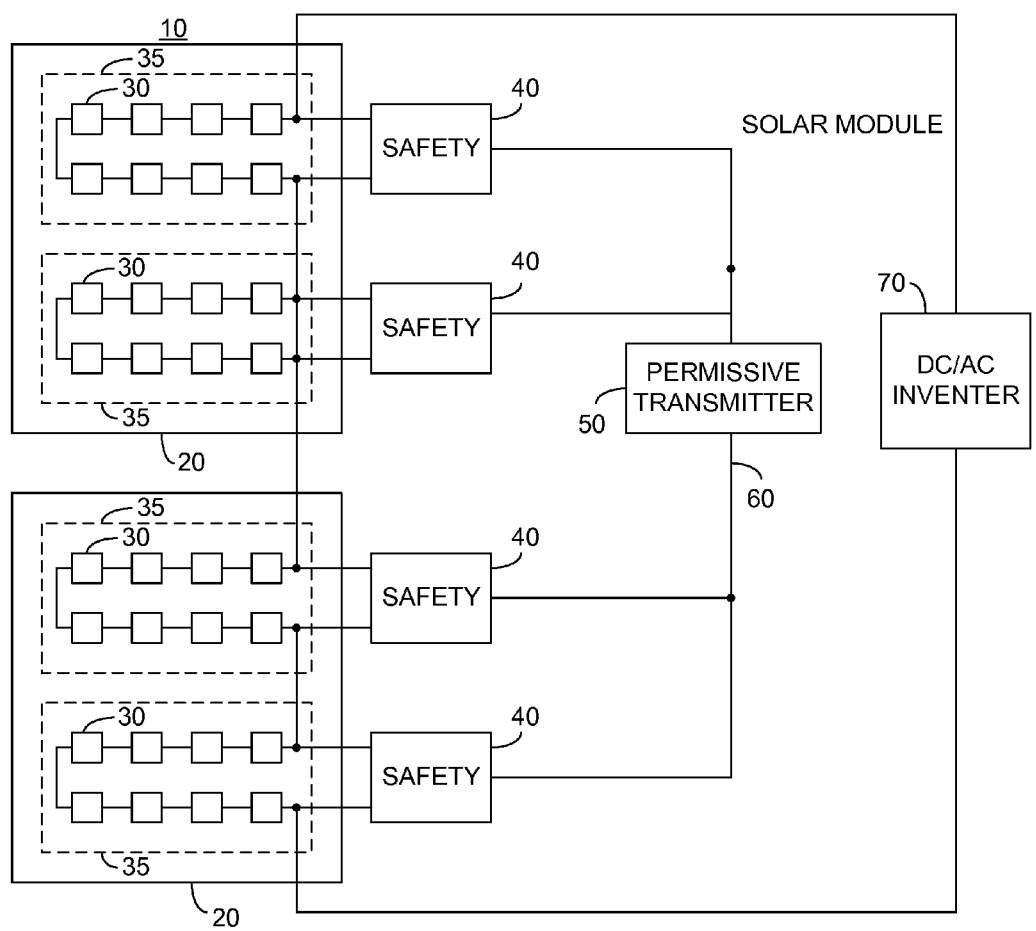
FIG. 1 illustrates a high level block diagram of a solar panel power source arrangement 10 with a safety mechanism of the present embodiments.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

The term asserted as used herein is meant to include an active signal condition, and thus the term may be used irrespective of polarity. The term de-asserted, or not asserted, is meant herein to describe a condition wherein the active signal is absent.

A solution to communicate with a safety mechanism should preferably comply with the assumption that a control signal will not be available during a fire. Therefore, the control method should be "permissive", in that the solar modules should only be allowed to convert energy when a compliant signal is communicated to, received at, and detected by, the safety mechanism. Lacking a confirmed received and detected compliant signal, the solar module should default to a non-energy converting state. An electronically controlled switch, such as a transistor, may be arranged across the output terminals of a solar cell group, and if closed would ensure that the solar cell group presents a near-zero voltage potential to an observer, however internal to the solar cell group being bypassed, a voltage potential still exists. Therefore, it is preferred that a solution that utilizes a short-circuit transistor provides an effective short circuit across a solar cell group with only enough cells such that there will not be a high enough internal voltage to maintain an electrical arcing path and/or there will not be a high enough internal voltage to cause dangerous electrocution. In practice, this means that one single short-circuit electronically controlled switch per solar module might not be sufficient. It typically will require a short circuit electronically controlled switch every 12-24 solar cells. In order to keep the total voltage of the whole serially connected group of cells safe, and assuming that 60 volts is a dangerous voltage threshold, without limitation, this means that each group of cells with an effective short circuit electronically controlled switch arranged there across must have its voltage below 1 volt. Such a group may be considered an island. In practice, the short-circuited voltage is preferably less than 0.1 volts per island.

Once an island of solar cells is short-circuited by its respective electronically controlled switch, it needs to remain short-circuited until a compliant signal is received, and detected, to allow normal operation. During this indefinite period of time that the short-circuit operation is occurring, the electronically controlled switch must remain activated and additionally the signal receiver must continue to seek a compliant signal. The primary source of energy that is available, and reliable, is the resulting short-circuit voltage, since other sources may have been removed by fire or other emergency. Advantageously, the present embodiments harvest energy from this short-circuit voltage and provide the harvested energy to the receiver, and further preferably to the electronically controlled switch.

In normal operation, all of the bypass grouped islands are at different DC voltage potentials with respect to ground. There may be a difference of up to 600 Volts DC between the lowest island and the highest island. Although not impossible, this does complicate the design in the event that a separate signal wire is provided to transmit the compliant signal to the receivers of the various safety mechanisms. Power for the various safety mechanisms is similarly affected. For example, a transistor implementation of the electronically controlled switch on an island which is closest to ground would need +5 volts in relation to ground to activate. The same transistor implementation in a module which is at a potential that is 300 VDC further up the string would require a DC voltage of +305 VDC in relation to ground to activate.

Advantageously, the safety mechanism of the present embodiments may be further utilized to provide a bypass function. Such a bypass function is well known in the industry, and in certain embodiments is implemented actively, such as the bypass element described in U.S. Pat. No. 8,169,252 issued May 1, 2012 to Fahrenbruch et al, entitled "Low Voltage Drop Closed Loop Unidirectional Electronic Valve", the entire contents of which is incorporated herein by reference.

The present bypass mechanism is preferably instantiated at multiple places in a typical solar installation. Typically one instance will be configured in parallel with as many solar cells as possible such that the maximum interior voltage of that local grouping of solar cells does not present either a high enough energy for either sustained DC arcing or electrocution hazard when the bypass mechanism is active. Further, in practice, another limiting factor for how many cells are placed in parallel with the invention will be determined by the minimum avalanche voltage of the cells themselves.

FIG. 1 illustrates a high level block diagram of a solar panel power source arrangement 10 with a safety mechanism of the present embodiments comprising: a plurality of solar modules 20 each with a plurality of solar cells 30 connected in series and arranged in solar cell groups 35; a plurality of safety mechanisms 40, each coupled across a particular solar cell group 35; a permissive transmitter 50; a communication channel 60; and a DC/AC inverter 70. Solar modules 20 are connected in series with DC/AC inverter 70. Each solar cell group 35 comprises one or more serially connected solar cells 30. Each safety mechanism 40 is in communication with permissive transmitter 50 over communication channel 60, which is illustrated as a single communication channel, without limitation. Communication channel 60 is in one embodiment wired, and in another embodiment wireless. Communication channel 60 may be implemented as an RF signal, an opto-coupled signal, a DC signaling wire, or by power line carrier communications without limitation. Safety mechanism 40 may be individually addressed by permissive transmitter 50 over communication channel 60, or may be jointly addressed by permissive transmitter 50 over communication channel 60 without exceeding the scope. As described above, the number of solar cells 30 in a solar cell group 35 is typically smaller in number than the plurality of solar cells 30 comprising a solar module 20, however this is not meant to be limiting in any way.

In operation, responsive to a compliant signal output from permissive transmitter 50 received over communication channel 60, safety mechanism 40 maintains an open circuit across solar cell group 35 to which it is connected. Responsive to the absence of a detected received compliant signal at safety mechanism 40, which may result from permissive transmitter 50 not outputting the compliant signal, from a failure of communication channel 60, or from a failure of a receiver of safety mechanism 40 to successfully detect the compliant signal on communication channel 60, safety mechanism 40 is operative to present an effective short circuit across solar cell group 35 to which it is coupled thus providing safety.

The term effective short circuit, as utilized herein, is meant to include any short circuit which reduces the output voltage of solar cell group 35, which is actively generating electricity, to less than 1 volt, and preferably to less than 0.1 volts.

The term compliant signal as used herein is meant to include any signal which is compliant with a predetermined set of conditions, such that its presence is actively noted by a receiver. Such a compliant signal may comprise a predetermined code without exceeding the scope.

Figure 2A:
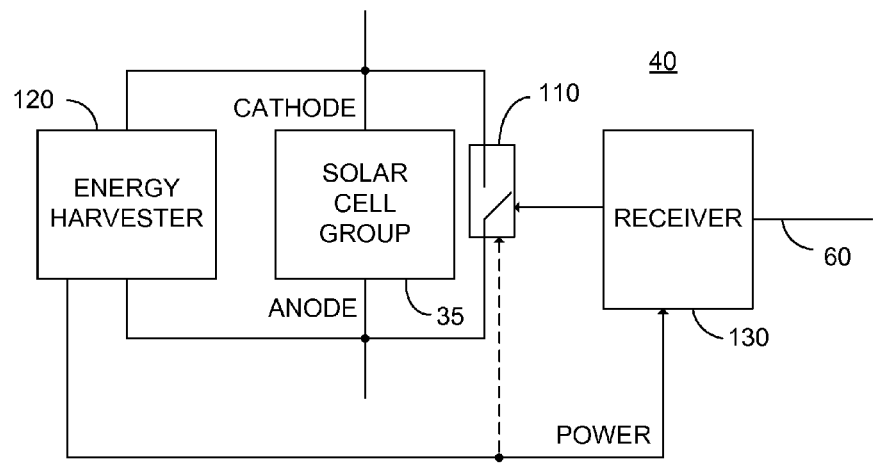
FIG. 2A illustrates a high level block diagram of an exemplary safety mechanism.

FIG. 2A illustrates a high level block diagram of an exemplary safety mechanism 40, illustrated with an associated solar cell group 35, the associated solar cell group 35 having a terminal CATHODE and an opposing terminal ANODE. In normal operation, when solar cell group 35 is generating electricity, terminal CATHODE is at a positive electric potential in relation to terminal ANODE. Each solar cell group 35 has an associated safety mechanism 40, and the various solar cell groups 35 are serially connected. For clarity, and ease of understanding, the particular solar cell group for which safety mechanism 40 is associated will be termed solar cell group 35, and the other serially connected solar cell groups will be described simply as other serially connected solar cell groups.

Safety mechanism 40 comprises: an electronically controlled switch 110; an energy harvester 120; and a receiver 130. Electronically controlled switch 110 is connected across output terminals CATHODE and ANODE of solar cell group 35, and is responsive to an output of receiver 130. Receiver 130 is arranged to receive signals over communication channel 60. Energy harvester 120 is arranged to harvest energy from solar cell group 35, and an output of energy harvester 120 is coupled to the power input of receiver 130. As described above, when solar cell group 35 is not generating electricity, and other solar cell groups serially connected thereto are generating electricity, reverse polarity of terminals CATHODE, ANODE of solar cell group 35 may occur. Optionally, power for electronically controlled switch 110 is further provided by energy harvester 120, as indicated by the broken line.

In operation, energy harvester 120 is arranged to provide operating energy for receiver 130 when solar cell group 35 is generating energy. Energy harvester 120 is further arrange to provide operating energy for receiver 130 when solar cell group 35 is unable to generate energy, whereas other solar cell groups within the series connection are generating energy, thus leading to a reverse bias condition for solar cell group 35 which is not generating electricity, as described above.

Receiver 130 is arranged to detect a compliant signal transmitted on communication channel 60 by permissive transmitter 50, and only in the event that the compliant signal is detected set electronically controlled switch 110 to an open state. In the event that the compliant signal is not detected, electronically controlled switch 110 is to the closed state, providing an effective short circuit across the terminals of solar cell group 35 and removing any safety hazard. Energy harvester 120 is optionally further arranged to provide power to electronically controlled switch 110 so as to maintain electronically controlled switch 110 in the closed state. Preferably, energy harvester 120 and electronically controlled switch 110 are arranged in a closed loop so as to maintain the effective short circuit without requiring refresh, as described in the above referenced U.S. Pat. No. 8,169,252.

Figure 2B:
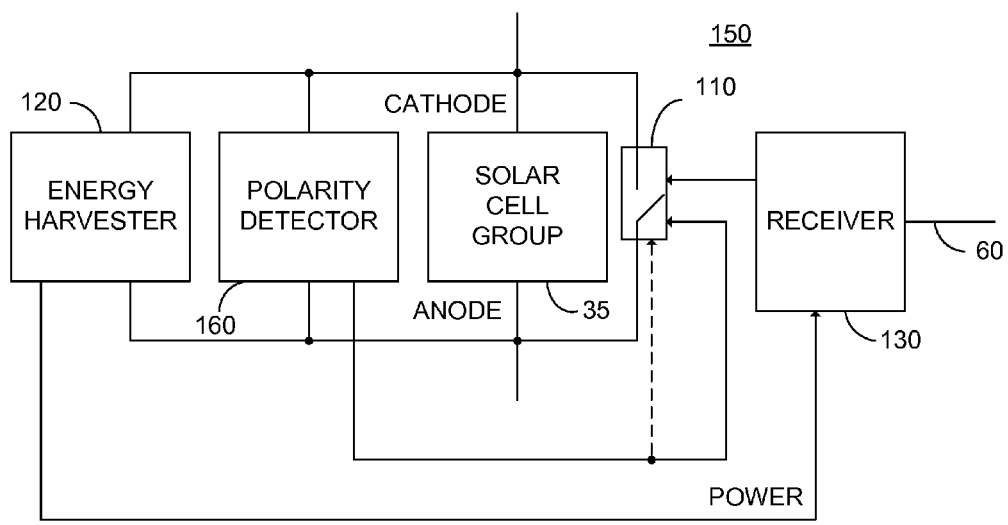
FIG. 2B illustrates a high level block diagram of an exemplary combination safety and bypass mechanism.

FIG. 2B illustrates a high level block diagram of an exemplary combination safety and bypass mechanism 150 illustrated in combination with the associated solar cell group 35. Bypass mechanism 150 comprises: an electronically controlled switch 110; an energy harvester 120; a receiver 130; and a polarity detector 160. Combination safety and bypass mechanism 150 may be used in place of safety mechanism 40 in arrangement 10. Electronically controlled switch 110 is connected across terminals CATHODE, ANODE of solar cell group 35, and is responsive to both an output of receiver 130 and to an output of polarity detector 160. Receiver 130 is arranged to receive signals over communication channel 60, particularly from permissive transmitter 50, as described above. Energy harvester 120 is arranged to harvest energy from solar cell group 35, and an output of energy harvester 120 is coupled to the power input of receiver 130. Optionally, power for electronically controlled switch 110 is further provided by energy harvester 120 as indicated by the broken line.

In operation, combination safety and bypass mechanism 150 is in all respects similar to safety mechanism 40 of FIG. 2A, with the exception that electronically controlled switch 110 additionally provides a bypass path in the event of polarity reversal of terminals CATHODE, ANODE of associated solar cell group 35. Thus, combination safety and bypass mechanism 150 provides both bypass path functionality and safety functionality for the associated solar cell group 35 via a single electronically controlled switch 110.

Figure 3:
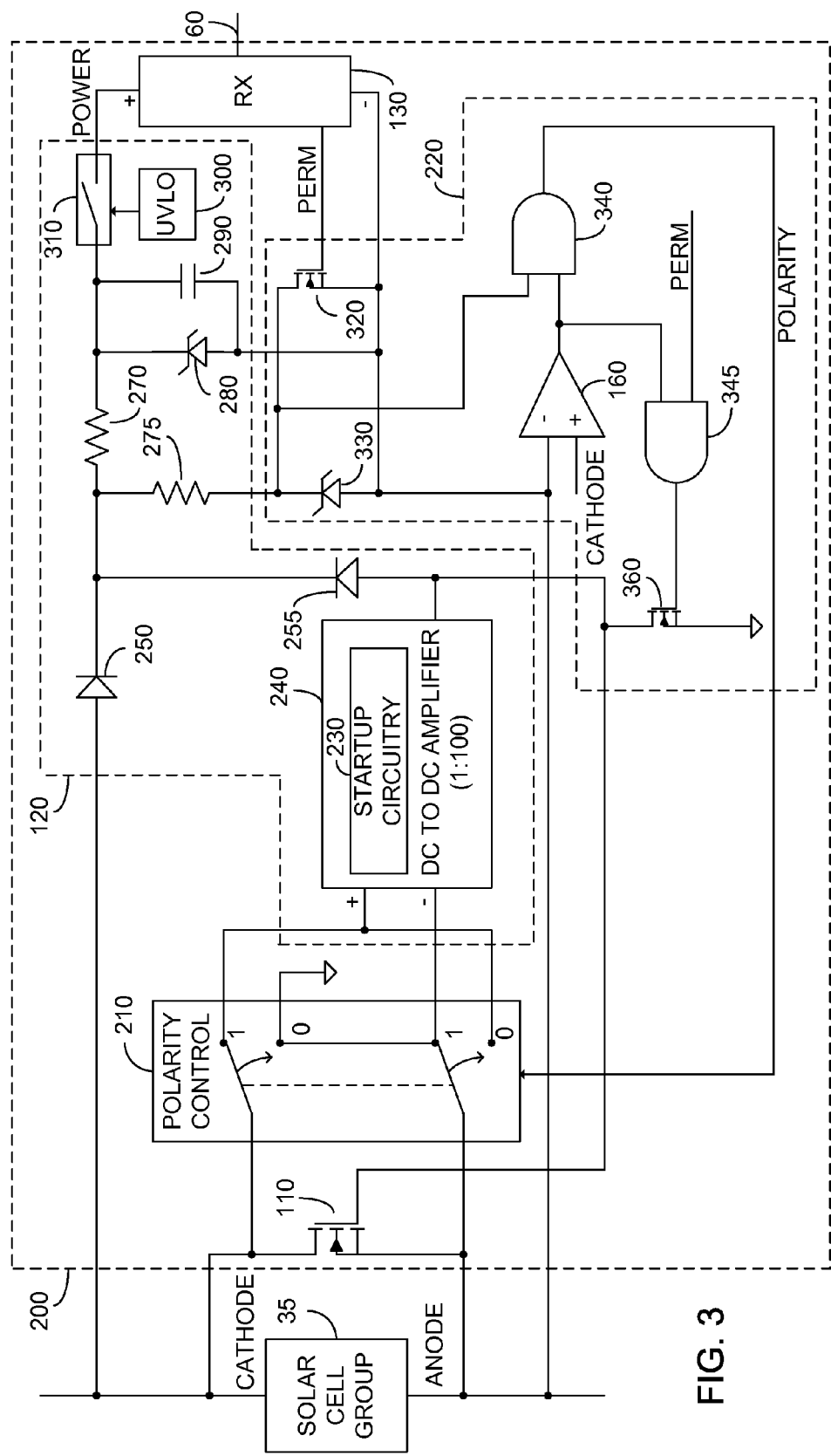
FIG. 3 illustrates a high level schematic diagram of an exemplary combination safety and bypass mechanism.

FIG. 3 illustrates a high level schematic diagram of an exemplary combination safety and bypass mechanism 200 illustrated with the associated solar cell group 35. Combination safety and bypass mechanism 200 comprises: an electronically controlled switch 110; an energy harvester 120; a receiver 130; a polarity control 210; and a control circuit 220. Energy harvester 120 comprises: a DC to DC amplifier 240 comprising a startup circuit 230; a first unidirectional electronic valve 250; a second unidirectional electronic valve 255; a first resistor 270; a second resistor 275; a breakdown diode 280; a capacitor 290; an under voltage lockout (UVLO) circuit 300; and an electronically controlled switch 310. Control circuit 220 comprises: an electronically controlled switch 320; a breakdown diode 330; a first AND gate 340; a second AND gate 345; a polarity detector 160, illustrated without limitation as a comparator; and an electronically controlled switch 360.

Each of electronically controlled switch 110, electronically controlled switch 320 and electronically controlled switch 360 are illustrated without limitation as implemented by an NMOSFET. Electronically controlled switch 310 may be similarly implemented as an NMOSFET without limitation. Polarity control 210 may be implemented with 4 electronically controlled switches, or a single double pole, double throw, electronically controlled switch, without limitation.

Electronically controlled switch 360 and second AND gate 345 are presented as separate elements, in one embodiment electronically controlled switch 360 and second AND gate 345 are implemented by a pair of serially connected NMOS- FETs, with gates of the various serially connected NMOS-FETs connected to voltage potentials performing the operation of second AND gate 345 without exceeding the scope.

Terminal CATHODE of solar cell group 35 is coupled to the drain of electronically controlled switch 110, to a first input of polarity control 210, to the anode of first unidirectional electronic valve 250 and to the non-inverting input of polarity detector 160. Terminal ANODE of solar cell group 35 is coupled to the source of electronically controlled switch 110, to a second input of polarity control 210 and to the inverting input of polarity detector 160. Polarity control 210 is arranged to alternately couple the first input to: the positive input of DC to DC amplifier 240 responsive to an asserted control input signal; or the internal common node responsive to a de-asserted control input signal. Polarity control 210 is further arranged to alternately couple the second input to: the internal common node responsive to the asserted control input signal; or to the positive input of DC to DC amplifier 240 responsive to the de-asserted control input signal.

DC to DC amplifier 240 is illustrated without limitation as a 1 to 100 DC to DC amplifier, and is responsive to startup circuit 230 which is arranged to provide an initial startup power for DC to DC amplifier 240. DC to DC amplifier 240 may be implemented by a charge pump, or an inductor based amplifier without exceeding the scope. The return of DC to DC amplifier 240 is coupled to the internal common potential node.

The output of DC to DC amplifier 240 is coupled to drain of electronically controlled switch 360, to the gate of electronically controlled switch 110 and to the anode of second unidirectional electronic valve 255. The cathode of second unidirectional electronic valve 255 is coupled to the cathode of first unidirectional electronic valve 250 and to a first end of each of first and second resistors 270, 275. A second end of first resistor 270 is coupled to the cathode of breakdown diode 280, to a first end of capacitor 290 and to a first port of electronically controlled switch 310. A second end of capacitor 290 is coupled to the anode of breakdown diode 280, to the source of electronically controlled switch 320 to the anode of breakdown diode 330, to the return terminal of receiver 130, and to the inverting input of polarity detector 160. As indicated above the inverting input of polarity detector 160 is further coupled to terminal ANODE of solar cell group 35 and to the source of electronically controlled switch 110.

The control output of UVLO circuit 300 is coupled to a control port of electronically controlled switch 310, and a second port of electronically controlled switch 310, is coupled to the power input of receiver 130, the coupling labeled POWER for clarity.

The signal output of receiver 130, labeled signal PERM, is coupled to the gate of electronically controlled switch 320. The drain of electronically controlled switch 320 is coupled to a second end of second resistor 275, the cathode of breakdown diode 330 and to a first input of first AND gate 340.

The output of polarity detector 160 is coupled to the second input of first AND gate 340 and to the first input of second AND gate 345. The output of first AND gate 340, denoted POLARITY, is coupled to the control input of polarity control 210. Signal PERM is further coupled to a second input of second AND gate 345, and the output of second AND gate 345 is coupled to the gate terminal of electronically controlled switch 360. The source of electronically controlled switch 360 is coupled to the internal common potential node.

In operation, startup circuitry 230 is arranged to provide an initial power for startup of DC to DC amplifier 240. Polarity control 210, responsive to the output of control circuit 220, and particularly to the output of first AND gate 340, is arranged to coupled startup circuit 230 and DC to DC amplifier 240 with alternating polarity across terminal CATHODE cathode and terminal ANODE of solar cell group 35. In particular, responsive to a first output condition of first AND gate 340, DC to DC amplifier 240 is coupled such that the positive input of DC to DC amplifier 240 is coupled to terminal CATHODE of solar cell group 35 and the return of DC to DC amplifier 240 is coupled to terminal ANODE of solar cell group 35. Responsive to a second output condition of first AND gate 340, DC to DC amplifier 240 is coupled such that the positive input of DC to DC amplifier 240 is coupled to terminal ANODE of solar cell group 35 and the return of DC to DC amplifier 240 is coupled to terminal CATHODE of solar cell group 35.

Signal PERM is asserted only when receiver 130 is powered and detects the compliant signal on communication channel 60, as described above.

In the event that solar cell group 35 is generating power, and signal PERM is asserted, a portion of the power generated by solar cell group 35 is passed by first unidirectional electronic valve 250 and first resistor 270 to charge capacitor 290 until a predetermined minimum voltage is developed across capacitor 290. Overvoltage is prevented by the operation of breakdown diode 280 and excess drain on solar cell group 35 is prevented by first resistor 270. Responsive to a predetermined minimum voltage develop across capacitor 290, UVLO circuit 300 closes electronically controlled switch 310 thereby providing an active POWER signal to receiver 130. Electronically controlled switch 110 is kept in the open state, i.e. does not provide an effective short circuit, responsive to electronically controlled switch 360 being closed by the asserted output of second AND gate 240, since both signal PERM is asserted and the output of polarity detector 160 is positive. Electronically controlled switch 360, when closed, connects the gate of electronically controlled switch 110 to the internal common potential node, thus preventing turn on of electronically controlled switch 110. Signal POLARITY is not asserted, and responsive thereto polarity control 210 is arranged to couple DC to DC amplifier 240 so that the positive input terminal of DC to DC amplifier 240 is coupled to terminal ANODE of solar cell group 35 and the return terminal of DC to DC amplifier 240 is coupled to terminal CATHODE of solar cell group 35.

In the event that solar cell group 35 is generating power, and signal PERM is not asserted, electronically controlled switch 110 provides an effective short circuit across the terminals of solar cell group 35, and signal POLARITY is asserted. Responsive to the asserted signal POLARITY, polarity control 210 is arranged to couple DC to DC amplifier 240 so that the positive input terminal of DC to DC amplifier 240 is coupled to terminal CATHODE of solar cell group 35 and the return of DC to DC amplifier 240 is coupled to terminal ANODE of solar cell group 35. The output of DC to DC amplifier 240 is fed to capacitor 290 via second unidirectional electronic valve 255 and first resistor 270. Overvoltage is prevented by the operation of breakdown diode 280 and excess drain is prevented by first resistor 270. Responsive to the predetermined minimum voltage develop across capacitor 290, UVLO circuit 300 closes electronically controlled switch 310 thereby providing an active POWER signal to receiver 130.

In the event that solar cell group 35 is not generating power, other solar cell groups connected serially with solar cell group 35 are generating power, the terminals of solar cell group 35 exhibit a reverse potential responsive to the inherent body diode of electronically controlled switch 110. Signal POLARITY is not asserted, and thus polarity control 210 is arranged to couple DC to DC amplifier 240 so that the positive input terminal of DC to DC amplifier 240 is coupled to terminal ANODE of solar cell group 35 and the return of DC to DC amplifier 240 is coupled to terminal CATHODE of solar cell group 35, responsive to the output of first AND gate 340. Electronically controlled switch 110 provides an effective short circuit across the terminals of solar cell group 35 as a safety mechanism, responsive to the output of DC to DC amplifier 240. Power to maintain electronically controlled switch 110 in a closed position, and power for receiver 130 are both provided from the output of DC to DC amplifier 240. The above state is irrespective of whether signal PERM is asserted or de-asserted, since each of first and second AND gates 340, 345 each receive at their respective inputs the output of polarity detector 160.

Table I below describes the states of various signals of control circuit 220 and the connection of polarity control 210 for clarity.

TABLE I

| PERM | Polarity Detected | POLARITY | +INPUT OF DC TO DC AMPLIFIER 240 | SWITCH 360 |
|---|---|---|---|---|
| Asserted | CATHODE Positive | Not asserted | ANODE | Closed |
| Not Asserted | ANODE Positive | Not asserted | ANODE | Open |
| Asserted | ANODE Positive | Not asserted | ANODE | Open |
| Not Asserted | CATHODE Positive | Asserted; | CATHODE | Open |

The above has been described in an embodiment where signal POLARITY is asserted responsive to an AND condition of signal PERM and the output of polarity detector 160, however this is not meant to be limiting in any way. In another embodiment, first AND gate 340 is not provided, and the control input of polarity control 210 is coupled to the output of polarity control 160. In such an embodiment, the + input of DC to DC amplifier 240 tracks the polarity of solar cell group 35, with the + input of DC to DC amplifier 240 coupled to node CATHODE when node CATHODE exhibits a positive potential in relation to node ANODE, and the + input of DC to DC amplifier 240 coupled to node ANODE when node ANODE exhibits a positive potential in relation to node CATHODE.

In order to better understand the operation of combination safety and bypass mechanism 200, a plurality of modes of operation are described below, each of the modes defining a switch setting in accordance with control circuit 220.

MODE #1: Normal operation with electronically controlled switch 310 already closed. Mode #1 is present when there is: no significant current mismatch, or shading, between the various serially connected solar cell groups; solar cell group 35 is generating electrical power; a compliant signal is presented on communication channel 60 indicative that no emergency or safety situation exists; and signal PERM is asserted. With electronically controlled switch 310 closed, power is supplied to receiver 130 from solar cell group 35 via the serial combination of first unidirectional electronic valve 250 and first resistor 270. As will be described further below, if electronically controlled switch 310 was open, it would be closed in a short time frame under these conditions responsive to control circuit 220.

When a compliant signal is detected by receiver 130 over communication channel 60, signal PERM output by receiver 130 is asserted, which turns on electronically controlled switch 320, and thereby causes the first input to first AND gate 340 to be de-asserted, also known as low, inactive or false. Because solar cell group 35 is providing solar powered current, the voltage potential at terminal CATHODE of solar cell group 35 is greater than the voltage potential at terminal ANODE of solar cell group 35, and thus the output of polarity detector 160 is high, also known as asserted, positive, active or true. Responsive to an asserted PERM signal and a high output of polarity detector 160, electronically controlled switch 360 is closed by second AND gate 345, thus preventing the closing of electronically controlled switch 110 by connecting the gate of electronically controlled switch 110 to the internal common node, and ensuring that substantial current output by solar cell group 35 is not short-circuited through electronically controlled switch 110. Further, because electronically controlled switch 110 is open, and terminal CATHODE of solar cell group 35 is at a higher potential than terminal ANODE of solar cell group 35, typically by 10-20 volts, a small current passes through first unidirectional electronic valve 250 and first resistor 270. The passed current charges capacitor 290 up to the clamping voltage set by breakdown diode 280, which in certain embodiments is selected to be 5 volts. Electronically controlled switch 310 is closed responsive to UVLO circuit 300 as long as the voltage potential across capacitor 290 is greater than the pre-determined voltage threshold, which in certain embodiments is selected to be 3 volts. UVLO circuit 300 is in one embodiment implemented by a comparator.

MODE #2: Normal operation with electronically controlled switch 310 initially open. Mode #2 is present when there is: no current mismatch, or shading, between solar cell groups serially connected; solar cell group 35 is generating electrical power; a compliant signal is presented on communication channel 60 indicative that no emergency or safety situation exists, however signal PERM is not asserted since signal POWER is not asserted to supply power to receiver 130.

In Mode #2 it is assumed that electronically controlled switch 310 is initially open, however as will be explained further below, in the event that electronically controlled switch 310 is open, electronically controlled switch 310 will be promptly driven to a closed state and operation will then be as described above in relation to MODE #1. Since signal PERM is not asserted, electronically controlled switch 320 is open, and the drain of electronically controlled switch 320 is pulled high by second resistor 275 to a clamped voltage set by breakdown diode 330, which in one particular embodiment is selected to be 5 volts. The potential of terminal CATHODE of solar cell group 35 greater than the potential of terminal ANODE of solar cell group 35, and thus the output of polarity detector 160 is high and thus signal POLARITY is asserted. Responsive to the asserted signal POLARITY, polarity control 210 is arranged to couple DC to DC amplifier 240 so that the positive input terminal of DC to DC amplifier 240 is coupled to cathode of solar cell group 35 and the return of DC to DC amplifier 240 is coupled to the anode of solar cell group 35. Electronically controlled switch 360 is set to open because signal PERM is not asserted. As indicated above DC to DC amplifier 240 in an exemplary embodiment provides a gain of 100-200 volts/volt. Therefore, if any positive potential difference between terminals CATHODE and ANODE of solar cell group 35 exists, it will be amplified and will close electronically controlled switch 110. This in turn, will short-circuit the current in the solar cell group 35.

Because solar cell group 35 is effectively short circuited by electronically controlled switch 110, a current enters the drain of electronically controlled switch 110 and exits through the source of electronically controlled switch 110. The resulting RdsON of electronically controlled switch 110 creates a small voltage, typically 50 mV @ 10 amps, across electronically controlled switch 110, which is amplified by DC to DC amplifier 240. The output of DC to DC amplifier 240 is in a closed loop arrangement with the electronically controlled switch 110, and thus provides power to maintain electronically controlled switch 110 in a closed state. The output DC to DC amplifier 240, which in one embodiment is in the range of 5-10 volts, charges capacitor 290 through first resistor 270. As described above, as soon as the voltage across capacitor 290 exceeds the pre-determined voltage threshold of UVLO circuit 300, UVLO circuit 300 closes electronically controlled switch 310, thus providing an active POWER signal to receiver 130.

As soon as an active POWER signal is provided to receiver 130, and in the presence of a compliant signal on communication channel 60, receiver 130 receives and detects the compliant signal and ultimately asserts signal PERM responsive thereto, closing electronically controlled switch 320, which in turn de-asserts signal POLARITY and closes electronically controlled switch 360. Responsive to the closing of electronically controlled switch 360, electronically controlled switch 110 is opened. This now fully restores normal operation of associated solar cell group 35, and operation is now the same as described above in "MODE #1.

MODE #3: Emergency operation with solar cell group 35 providing solar powered current, thus the voltage potential at terminal CATHODE of solar cell group 35 is greater than the voltage potential at terminal ANODE of solar cell group 35. A compliant signal is not presented on communication channel 60, indicative that an emergency or safety situation exists.

In Mode #3, since a compliant signal is not presented on communication channel 60, and thus is not detected by receiver 130, signal PERM is not asserted. The drain of electronically controlled switch 320 is therefore pulled high via second resistor 275 to a clamped voltage set responsive to breakdown diode 330. Since the voltage potential at terminal CATHODE of solar cell group 35 is greater than the voltage potential at terminal ANODE of solar cell group 35, the output of polarity detector 160 is asserted and signal POLARITY is thus asserted responsive to first AND gate 340. Responsive to the asserted signal POLARITY, polarity control 210 is arranged to couple DC to DC amplifier 240 so that the positive input terminal of DC to DC amplifier 240 is coupled to terminal CATHODE of solar cell group 35 and the return of DC to DC amplifier 240 is coupled to terminal ANODE of solar cell group 35. Since signal PERM is not asserted, the output of second AND gate 345 is not asserted, and electronically controlled switch 360 is open.

The positive potential difference between terminals CATHODE and ANODE of solar cell group 35 is amplified by DC to DC amplifier 240 and closes electronically controlled switch 110, thus providing an effective short-circuit across terminals CATHODE and ANODE of solar cell group 35. Because solar cell group 35 is effectively short circuited by electronically controlled switch 110, a current enters the drain of electronically controlled switch 110 and exits through the source of electronically controlled switch 110. The resulting RdsON of electronically controlled switch 110 creates a small voltage, typically 50 mV @ 10 amps, across electronically controlled switch 110, which is amplified by DC to DC amplifier 240. The output of DC to DC amplifier 240 is in a closed loop arrangement with the electronically controlled switch 110, and thus provides power to maintain electronically controlled switch 110 in a closed state. The output of DC to DC amplifier 240 is fed to capacitor 290 via second unidirectional electronic valve 255 thus providing power for receiver 130. In the event that insufficient power is available from DC to DC amplifier 240 to maintain receiver 130 in continuous active state, power is supplied discontinuously to receiver 130 responsive to the charging and discharging of capacitor 290 and the action of UVLO circuit 300, which is preferably provided with hysteresis sufficient for discontinuous operation of receiver 130. When an active POWER signal is supplied to receiver 130, receiver 130 examines communication channel 60 for the presence, or absence, of the compliant signal.

In the event that when an active POWER signal is supplied to receiver 130 the compliant signal is detected by receiver 130, signal PERM is asserted by receiver 130 and control circuit 220 transitions the operation of safety and bypass mechanism 200 to Mode #1, as described above.

Thus, as long as signal PERM is not asserted because a compliant signal has not been detected on communication channel 60, and solar power is being generated by solar cell group 35, the safety mechanism of combination safety and bypass mechanism 200 remains in a state where electronically controlled switch 110 provides an effective short circuit across the output of solar cell group 35, and power is supplied, at least discontinuously, to receiver 130. The resultant short-circuit voltage between terminals CATHODE and ANODE of solar cell group 35 will remain small, typically 50 mV. This will result in the gate of electronically controlled switch 110 being driven to 5-10 volts with respect terminal ANODE of solar cell group 35 which is coupled to the internal common potential node by polarity control 210, and a closed loop path is present maintaining this state until a compliant signal is detected on communication channel 60, or the polarity of voltage across solar cell group 35 reverses due to shading or other solar cell mismatch condition.

It is to be understood that an identical result occurs if receiver 130 is not powered, e.g. if electronically controlled switch 310 is open. Effectively, a lack of power for receiver 130 results in receiver 130 being unable to detect a compliant signal, and thus signal PERM is not asserted.

MODE #4: Emergency operation with solar cell group 35 not providing solar powered current, however power is being supplied by other solar cell groups serially connected thereto, and thus the voltage potential at terminal ANODE of solar cell group 35 is greater than the voltage potential at terminal CATHODE of solar cell group 35. A compliant signal is not presented on communication channel 60, indicative that emergency or safety situation exists.

In Mode #4, since a compliant signal is not presented on communication channel 60, signal PERM is not asserted. The drain of electronically controlled switch 320 therefore pulled high via second resistor 275 to a clamped voltage set responsive to breakdown diode 330. Since the voltage potential at terminal ANODE of solar cell group 35 is greater than the voltage potential at terminal CATHODE of solar cell group 35, the output of polarity detector 160 is de-asserted and signal POLARITY is thus low responsive to first AND gate 340. Responsive to the de-asserted signal POLARITY, polarity control 210 is arranged to couple DC to DC amplifier 240 so that the positive input terminal of DC to DC amplifier 240 is coupled to terminal ANODE of solar cell group 35 and the return of DC to DC amplifier 240 is coupled to terminal CATHODE of solar cell group 35. Since signal PERM is not asserted, the output of second AND gate 345 is not asserted, and electronically controlled switch 360 is open.

The positive potential difference between terminals ANODE and CATHODE of solar cell group 35 is amplified by DC to DC amplifier 240 and closes electronically controlled switch 110. The closed state of electronically controlled switch 110 provides an effective short-circuit across solar cell group 35 for the passage of current from serially connected generating solar cell groups, which current enters through the source of electronically controlled switch 110 and exits through the drain of electronically controlled switch 110. The resulting RdsON of electronically controlled switch 110 creates a small voltage, typically 50 mV @ 10 amps, across electronically controlled switch 110, which is amplified by DC to DC amplifier 240. The output of DC to DC amplifier 240 is in a closed loop arrangement with electronically controlled switch 110, and thus provides power to maintain electronically controlled switch 110 in a closed state, thus providing a bypass mechanism for associated solar cell group 35. It is to be noted that due to polarity control 210 the output of DC to DC amplifier 240 is positive in relation to terminal CATHODE of solar cell group 35 which is coupled to the internal common potential node. As described above, in the event that power required by receiver 130 is greater than that which can be harvested from the voltage drop across electronically controlled switch 110, electronically controlled switch 310 supplies power discontinuously to receiver 130 responsive to the charging and discharging of capacitor 290 and the action of UVLO circuit 300, which is preferably provided with hysteresis sufficient for discontinuous operation of receiver 130. When an active POWER signal is supplied to receiver 130, receiver 130 examines communication channel 60 for the presence, or absence, of the compliant signal.

In the event that a compliant signal is detected by receiver 130, signal PERM will be asserted, however no change in state occurs since both first and second AND gates 340 receive the output of polarity detector 160 as a second input. In the event that a compliant signal is detected by receiver 130, and solar cell group 35 begins to generate electrical energy such that terminal CATHODE of solar cell group 35 becomes positive in relation to terminal ANODE of solar cell group 35, operation proceeds as described above in MODE #1. In the event that a compliant signal is not detected by receiver 130, and solar cell group 35 begins to generate electrical energy such that terminal CATHODE of solar cell group 35 becomes positive in relation to terminal ANODE of solar cell group 35, operation proceeds as described above in MODE #3.

MODE #5: Transition between emergency operation, i.e. from a condition where the compliant signal was absent, or not detected, on communication channel 60, to a condition where the compliant signal is presented and detected, on communication channel 60, with solar cell group 35 providing solar powered current, i.e. the voltage potential at terminal CATHODE of solar cell group 35 is greater than the voltage potential at terminal ANODE of solar cell group 35.

In Mode #5, since the compliant signal had previously been absent from communication channel 60, upon a compliant signal being received and detected by receiver 130 responsive to an active POWER signal from electronically controlled switch 310, signal PERM is asserted. The assertion of signal PERM, in combination with a high output of polarity detector 160 closes electronically controlled switch 360, which thus forces electronically controlled switch 110 to a open state, thus removing the effective short circuit.

MODE #6: Transition between emergency operation, i.e. from a condition where the compliant signal was absent, or not detected, on communication channel 60, to a condition were the compliant signal is presented, received and detected, on communication channel 60, with solar cell group 35 not providing solar powered current but other serially connected solar cell groups providing power, i.e. the voltage potential at terminal ANODE of solar cell group 35 is greater than the voltage potential at terminal CATHODE of solar cell group 35.

In Mode #6, since the compliant signal had previously been absent from communication channel 60, upon a compliant signal being detected by receiver 130, responsive to an active POWER signal received via electronically controlled switch 310, signal PERM is asserted. However, since the output of polarity detector 160 is low, the output of both first and second AND gates 340 are unchanged, and remain de-asserted. Polarity control 210 continues to couple DC to DC amplifier 240 so that the positive input terminal of DC to DC amplifier 240 is coupled to terminal ANODE of solar cell group 35 and the return of DC to DC amplifier 240 is coupled to terminal CATHODE of solar cell group 35. It is to be noted that electronically controlled switch 110 remains closed thus providing bypass diode functionality. It will remain in this state until solar cell group 35 produces sufficient energy to set terminal CATHODE to a positive potential in relation to terminal ANODE, or in the event that other serially connected solar cells cease producing electricity, as will be described below in MODE #7. This is not an emergency shut down mode responsive to an absent compliant signal, but is instead a bypass mode, which is here advantageously provide by combination safety and bypass mechanism 200.

MODE #7: No input energy is present in any of the serially connected solar cell groups, such as at night. Terminal CATHODE is at the same potential as terminal ANODE.

In Mode #7, there is no energy present in the system, and thus no energy is available to operate combination safety and bypass mechanism 200. Electronically controlled switch 110 is open. No energy is available for receiver 130 to check for the presence of the compliant signal on communication channel 60, and thus the actual state of the compliant signal is not relevant. As soon as the associated solar cell group 35 being to generate energy, the potential at terminal CATHODE will rise above the potential at terminal ANODE, and energy will begin to be supplied to charge up capacitor 290. Signal PERM is de-asserted, since power has not been supplied to receiver 130, and as energy is supplied via first unidirectional electronic valve 250, the output of polarity detector 160 is high, thus asserting signal polarity via first AND gate 340, which sets polarity control 210 to couple DC to DC amplifier 240 so that the positive input terminal of DC to DC amplifier 240 is coupled to terminal CATHODE of solar cell group 35 and the return of DC to DC amplifier 240 is coupled to terminal ANODE of solar cell group 35. DC to DC amplifier 240 thus generates energy to close electronically controlled switch 110 and provide an effective short circuit across solar cell group 35, while harvesting energy to provide power to charge capacitor 290 and ultimately power receiver 130. When signal POWER is asserted to receiver 130, receiver 130 inspects communication channel 60 for the presence of the compliant signal, and if presented and detected, asserts signal PERM. As described above, once signal PERM is asserted, and with the output of polarity detector 160 high, electronically controlled switch 360 is closed thus forcing electronically controlled switch 110 open, and removing the effective short circuit.

Figure 4:
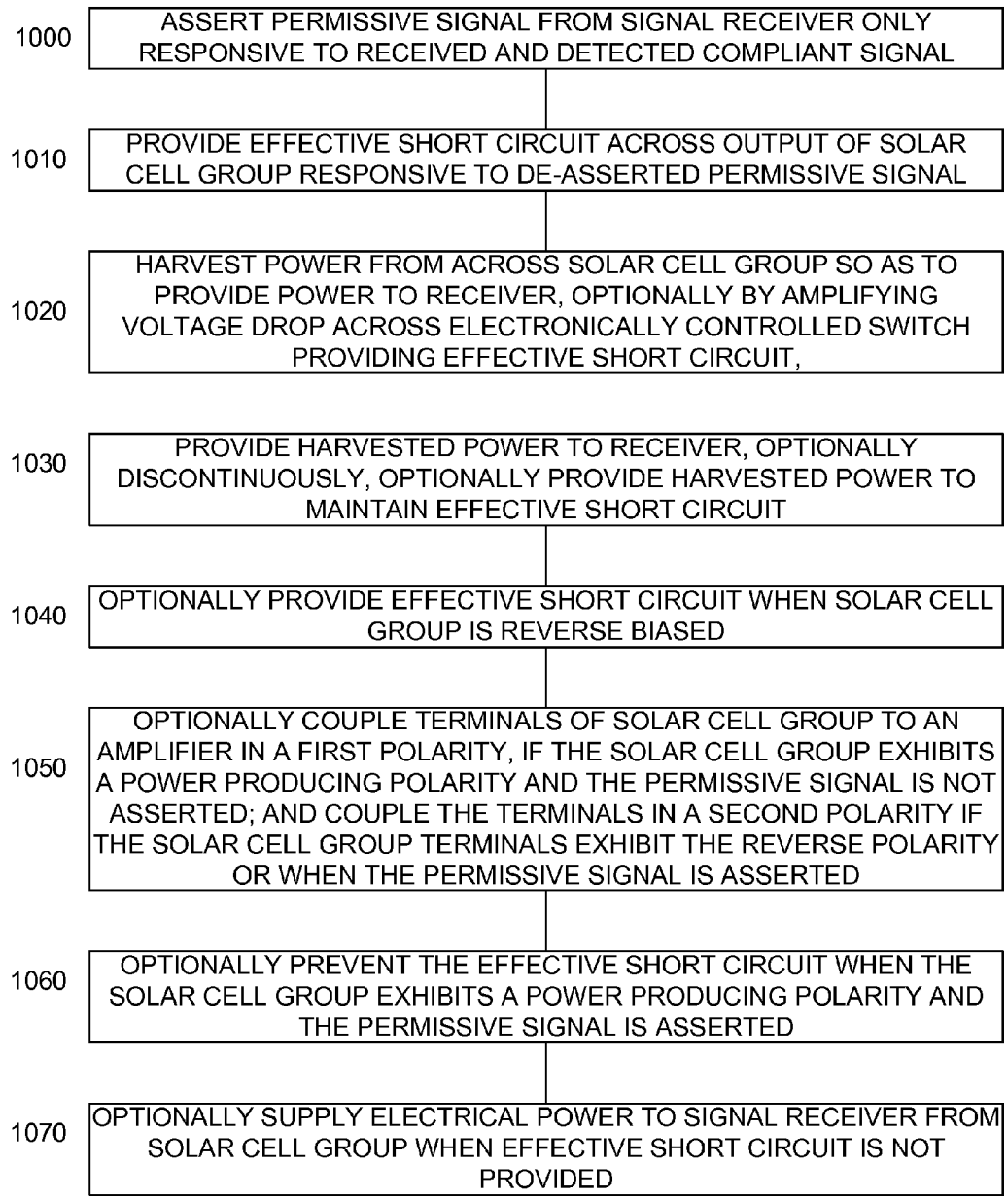
FIG. 4 illustrates a high level flow chart of an exemplary method of providing safety for a solar cell group.

FIG. 4 illustrates a high level flow chart of an exemplary method of providing safety for a solar cell group. In stage 1000, a permissive signal is asserted by a signal receiver, such as receiver 130, responsive to a compliant received signal, such as a compliant signal received on communication channel 60. In stage 1010, an effective short circuit is provided across the output of a solar cell group responsive to the absence of an asserted permissive signal from the permissive receiver. As described above the absence of an asserted permissive signal from the receiver is responsive to the lack of a transmitted compliant signal, or to the lack of an active power signal for the permissive receiver to detect such a compliant signal.

In stage 1020, power is harvested from across the solar cell group. Optionally, the power is harvested by amplifying the voltage drop across the electronically controlled switch providing the effective short circuit of stage 1010.

In stage 1030, the harvested power is provided to the signal receiver. Optionally, power is provided to the signal receiver discontinuously. Optionally, harvested power of stage 1020 is further provided to maintain the effective short circuit of stage 1010.

In optional stage 1040, an effective short circuit across the solar cell group is provided when the solar cell group is reverse biased, i.e. when terminal CATHODE exhibits a potential less than the potential of terminal ANODE. Optional stage 130 thus provides a bypass path for the solar cell group.

In optional stage 1050, the terminals of the solar cell group are coupled to a DC to DC amplifier, such as DC to DC amplifier 240, in a first polarity in the event that: the solar cell group exhibits a polarity associated with the solar cell group producing power; and the permissive signal is not asserted by the signal receiver. The terminals of the solar cell group are coupled to the DC to DC amplifier in the reverse polarity if: the solar cell group exhibits a polarity opposite the power producing polarity; or the when the permissive signal is asserted by the signal receiver.

In optional stage 1060, the effective short circuit of stage 1010 is prevented, such as by the operation of electronically controlled switch 360, in the event that: the solar cell group exhibits a power producing polarity and the permissive signal is asserted by the signal receiver.

In optional stage 1070, electrical power is supplied to the permissive receiver from the solar cell group when an effective short circuit is not provided, such as described above in relation to first unidirectional electronic valve 250.

Thus, a safety mechanism is supplied for a solar panel. The safety mechanism is arranged to be responsive to a received compliant signal, and to provide power for the safety mechanism. When the compliant signal is detected, the safety mechanism allows the solar panel to output electrical energy. When the compliant signal is not detected, the safety mechanism provide an effective short circuit across the output of the associated solar cell group, and continues to provide power for the safety mechanism to at least discontinuously check the state of the compliant signal and preferably maintain the effective short circuit.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described herein above. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

The invention claimed is:

1. A safety mechanism for a solar cell group, the safety mechanism comprising:
    a signal receiver arranged to assert a permissive signal indicative of reception by said signal receiver of a predetermined signal;
    an electronically controlled switch arranged to provide in a first state an effective short circuit across the output of the solar cell group responsive to the absence of the asserted permissive signal of said signal receiver; and
    a power harvester in communication with the solar cell group and arranged to provide an electric power to said signal receiver when said electronically controlled switch is in the first state, said power harvester comprising a direct current (DC) to DC amplifier arranged to amplify the voltage drop across said electronically controlled switch when said electronically controlled switch is in the first state so as to thereby provide the electric power to said signal receiver when said electronically controlled switch is in the first state.

2. The safety mechanism according to claim 1, wherein the signal receiver is further arranged to de-assert the permissive signal responsive to one of:
    non-reception by said signal receiver of the predetermined signal; and
    a lack of said provided electrical power from said power harvester.

3. The safety mechanism according to claim 1, wherein said power harvester is further arranged to supply power to said electronically controlled switch so as to maintain said electronically controlled switch in the first state.

4. The safety mechanism according to claim 1, wherein said provided electric power from said power harvester, when said electronically controlled switch is in said first state, is discontinuously provided to said signal receiver.

5. The safety mechanism according to claim 1, wherein the solar cell group comprises a cathode terminal and an anode terminal, and wherein the safety mechanism further comprises a control circuitry arranged to set said electronically controlled switch to the first state when the cathode terminal of the solar cell group is negative in relation to the anode terminal of the solar cell group, thus providing a bypass mechanism for the solar cell group.

6. The safety mechanism according to claim 5, wherein said control circuitry is further arranged to:
    set said electronically controlled switch to a second state when the cathode terminal of the solar cell group is positive in relation to the anode terminal of the solar cell group and the permissive signal is asserted by said signal receiver, said electronically controlled switch in said second state arranged to allow the solar generated output of the solar cell group to appear across the output terminals of the solar cell group; and
    wherein said power harvester is arranged to provide the electric power to said signal receiver from the solar generated output of the solar cell group when said electronically controlled switch is the second state.

7. A safety mechanism for a solar cell group, the safety mechanism comprising:
- a signal receiver arranged to assert a permissive signal indicative of reception by said signal receiver of a predetermined signal;
- an electronically controlled switch arranged to provide in a first state an effective short circuit across the output of the solar cell group responsive to the absence of the asserted permissive signal of said signal receiver;
- a polarity control circuit; and
- a power harvester in communication with the solar cell group and arranged to provide an electric power to said signal receiver when said electronically controlled switch is in the first state,
- wherein said power harvester comprises a direct current (DC) to DC amplifier, and wherein the solar cell group exhibits a cathode terminal and anode terminal, and wherein said polarity control circuit is arranged to connect the DC to DC amplifier to the respective cathode terminal and anode terminal of the solar cell group alternately in a first polarity and in a second polarity.

8. The safety mechanism according to claim 7, further comprising a control circuit, said polarity control circuit responsive to said control circuit, said control circuit arranged to set said polarity control circuit to connect the positive input of the DC to DC amplifier to the cathode terminal of the solar cell group responsive to:
- the solar cell group cathode terminal electric potential being greater than the solar cell group anode terminal electric potential; and
- the absence of the asserted permissive signal of said signal receiver.

9. The safety mechanism according to claim 8, wherein said control circuit is further arranged to set said polarity control circuit to connect the positive input of the DC to DC amplifier to the anode terminal of the solar cell group responsive to:
- the solar cell group anode terminal electric potential being greater than the solar cell group cathode terminal electric potential; or
- the presence of the asserted permissive signal of said signal receiver.

10. The safety mechanism according to claim 8, wherein said control circuit is further arranged to prevent said electronically controlled switch from providing the effective short circuit across the output of the solar cell group responsive to:
- the solar cell group cathode terminal electric potential being greater than the solar cell group anode terminal electric potential; and
- the presence of the asserted permissive signal of said signal receiver.

11. A method of providing safety for a solar cell group, the method comprising:
- asserting a permissive signal output from a signal receiver responsive to reception of a predetermined signal by the signal receiver;
- providing an effective short circuit across the output of the solar cell group responsive to the absence of the asserted permissive signal;
- harvesting power from across the solar cell group; and
- supplying at least a portion of said harvested power to the signal receiver when said effective short circuit is provided,
- wherein said harvesting power comprises:
  - coupling the cathode terminal of the solar cell group to an amplifier in a first polarity to harvest said power; and
  - amplifying the voltage potential difference between the cathode terminal and the anode terminal,
  - said coupling in the first polarity responsive to:
    - the solar cell group cathode potential being greater than the solar cell group anode potential; and
    - the absence of the asserted permissive signal of the signal receiver, and
  - coupling the cathode terminal of the solar cell group to the amplifier in a second polarity so as to harvest said power, the second polarity opposing the first polarity, responsive to:
    - the solar cell group anode terminal potential being greater than the solar cell group cathode terminal potential; or
    - the presence of the asserted permissive signal of the signal receiver.

12. The method according to claim 11, further comprising supplying at least a portion of said harvested power to maintain said provided effective short circuit.

13. The method according to claim 11, wherein said supplied harvested power is supplied to the signal receiver discontinuously.

14. The method according to claim 11, further comprising:
- additionally providing the effective short circuit when the cathode terminal of the solar cell group exhibits a negative potential in relation to the anode terminal of the solar cell group.

15. The method of claim 11, further comprising:
- preventing said providing of the effective short circuit across the output of the solar cell group responsive to:
  - the solar cell group cathode terminal potential being greater than the solar cell group anode terminal potential; and
  - the presence of the asserted permissive signal of the signal receiver.

16. The method of claim 11, wherein said harvesting comprises:
- coupling electric power from a solar generated output of the solar cell group when said effective short circuit across the output of the solar cell group is not provided.

* * * * *